United States Patent [19]

Macovski

[11] Patent Number: 4,748,410
[45] Date of Patent: May 31, 1988

[54] RAPID NMR IMAGING SYSTEM

[75] Inventor: Albert Macovski, Menlo Park, Calif.

[73] Assignee: Stanford University, Stanford, Calif.

[21] Appl. No.: 893,793

[22] Filed: Aug. 6, 1986

[51] Int. Cl.⁴ ............................................. G01R 33/20
[52] U.S. Cl. ..................................... 324/309; 324/307
[58] Field of Search ................ 324/300, 307, 309, 306; 128/653

[56] References Cited

U.S. PATENT DOCUMENTS

| | | | |
|---|---|---|---|
| 4,602,641 | 7/1986 | Feinberg | 324/309 |
| 4,642,567 | 2/1987 | Kaplan | 324/309 |
| 4,651,096 | 3/1987 | Buonocore | 324/307 |

*Primary Examiner*—Michael J. Tokar
*Attorney, Agent, or Firm*—Flehr, Hohbach, Test, Albritton & Herbert

[57] ABSTRACT

The magnetic resonance activity of a region of a volume is imaged using a time varying gradient whose integral provides a constant velocity spiral in the spatial frequency domain. To provide high fidelity for relatively low values of $T_2$, high SNR for relatively high values, and a $T_2$ sensitive image, the spiral is retraced back to the origin. The gradient requirements are minimized using a sequence of interleaved spirals using separate excitations. For further time reduction, only half the spatial frequency domain can be scanned, using inversion excitations to reduce the effects of inhomogeneity.

25 Claims, 5 Drawing Sheets

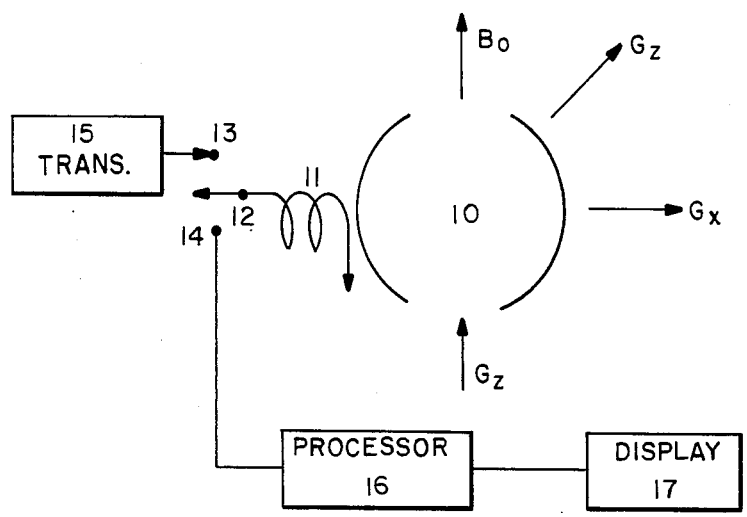
FIG.—1
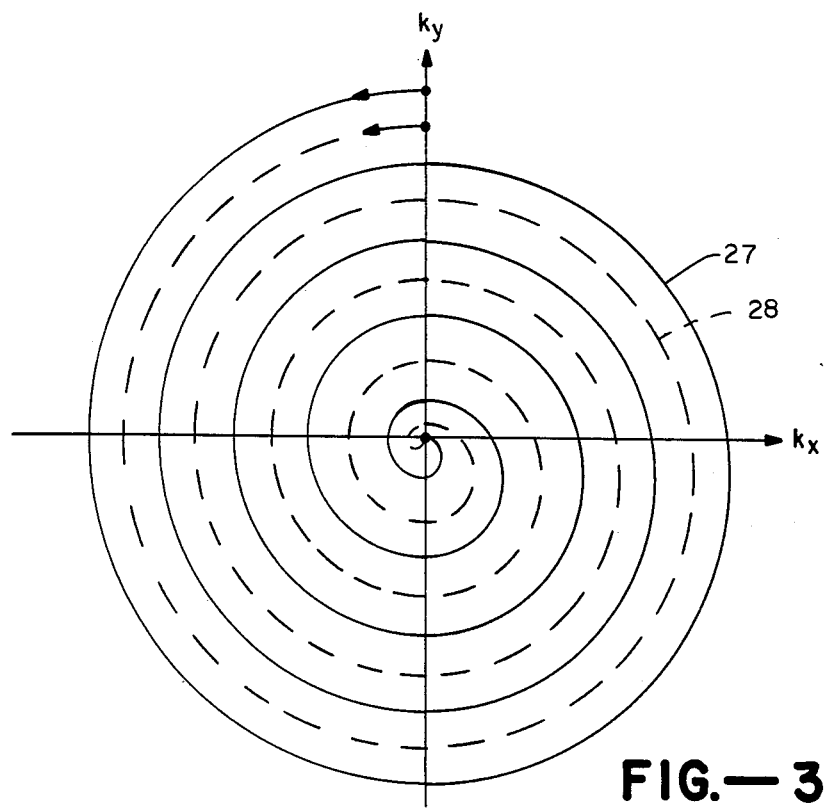
FIG.—3

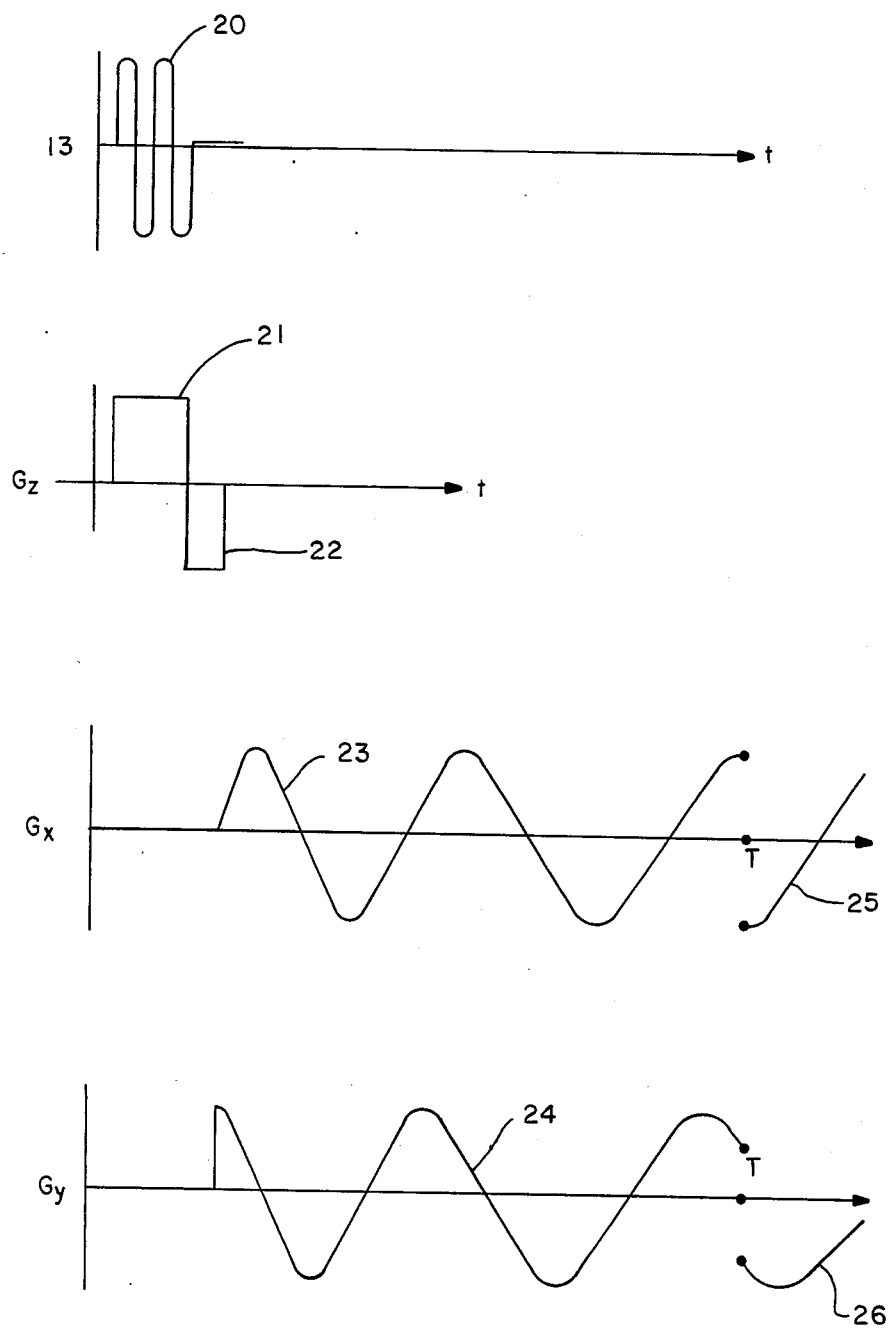
FIG.—2

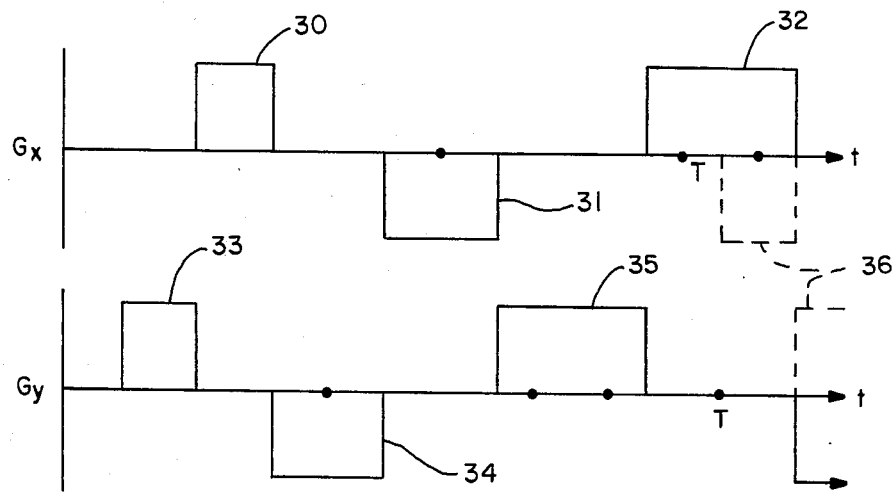
FIG.—4
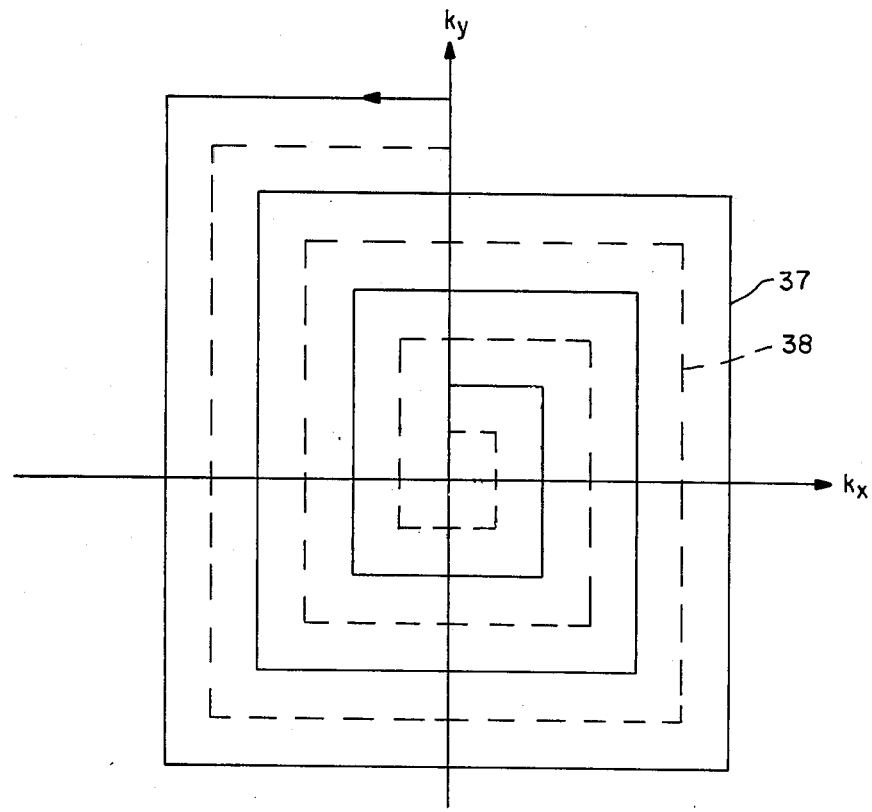
FIG.—5

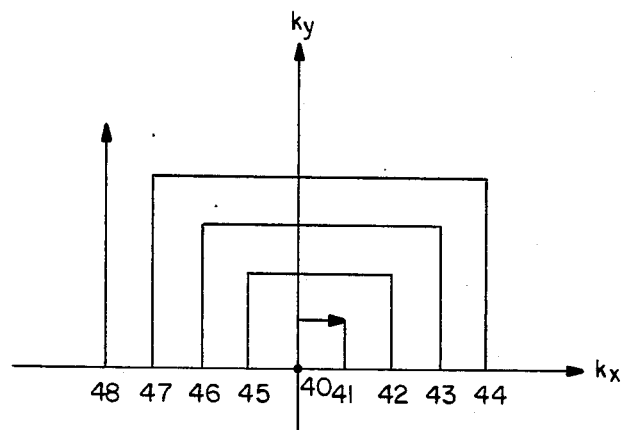
FIG.—6
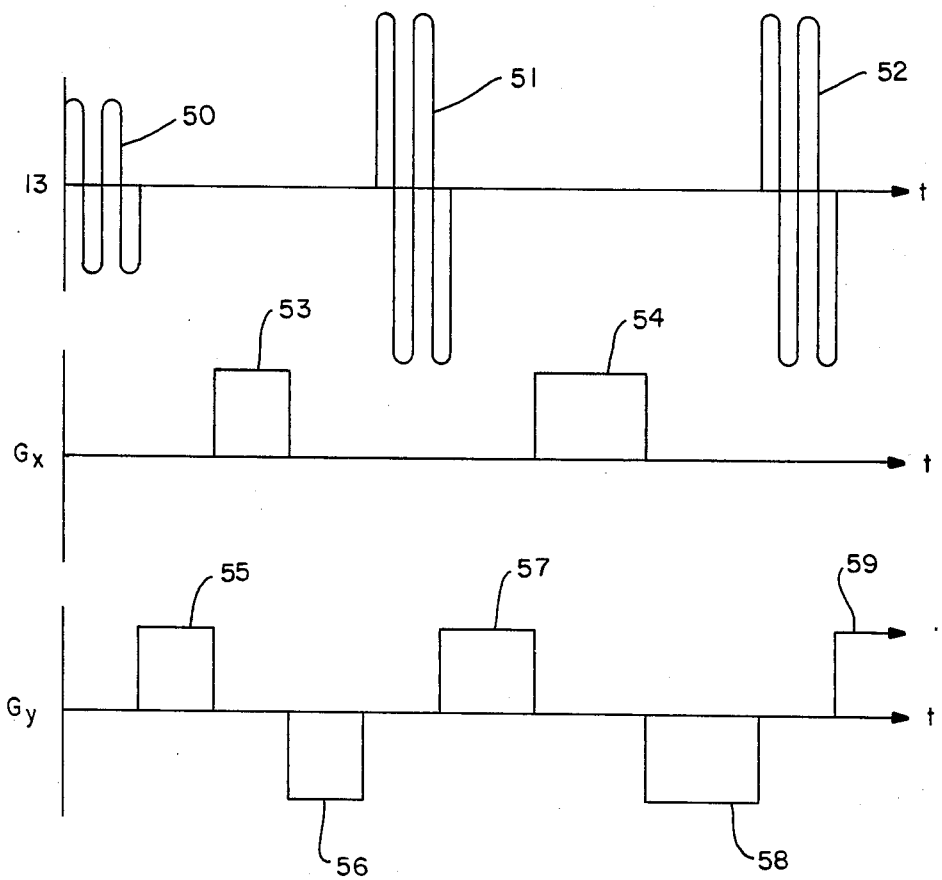
FIG.—7

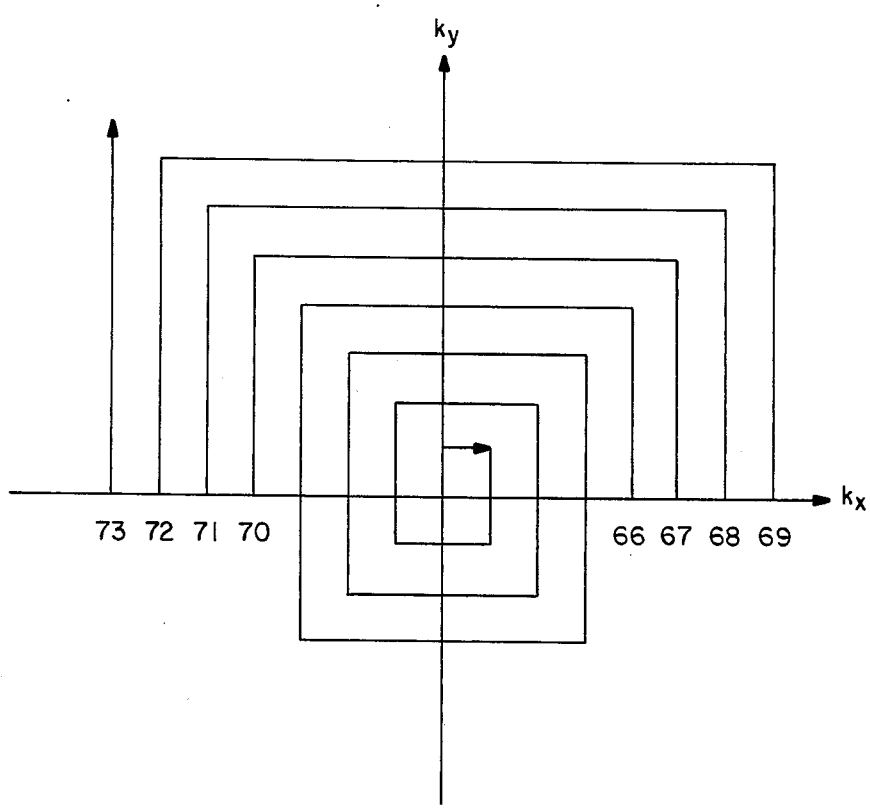
FIG.—8

RAPID NMR IMAGING SYSTEM

BACKGROUND OF THE INVENTION

1. Field of the Invention

This invention relates to NMR imaging. In a primary application it relates to rapidly acquiring the NMR data and producing high fidelity images relatively independent of the relaxation time.

2. Description of Prior Art

Existing magnetic resonance imaging systems use the 2DFT or spin warp system. This system is described, among other places, in a general tutorial paper "An Introduction to NMR Imaging From the Bloch Equation to the Imaging Equation," by W. S. Hinshaw and A. H. Lent in the *Proceedings of the IEEE*, Vol. 71, No. 3, March 1963. In this system a sequence of excitations are used, each providing a line in the spatial frequency domain, or k space. This is achieved by a variable area phase encoding gradient on one gradient axis, applied prior to readout which moves the k space scan to the desired line. Then, during readout, a fixed amplitude gradient is used to scan the selected line in k space. This provides a high quality image in a relatively long time since, for an n×n image, n separate scans are required, each of the order of one second.

A number of approaches have been taken to higher speed scans. Perhaps the earliest was the echo planar system described in a paper by P. Mansfield and I. L. Pykett in the *Journal of Magnetic Resonance*, Vol. 29, p. 355, 1978. In this method, following the excitation of a plane, a constant gradient as applied on one axis and a square wave on the other. This, in a single excitation, provides a rapid scan of k space. The time of the scan represents a compromise. If it is relatively short, the SNR of materials with long relaxation times will be compromised. If it is relatively long, materials with short $T_2$'s will achieve only a partial scan of k space and be distorted.

Another approach to rapid imaging was presented by C. B. Ahn, J. H. Kim and Z. H. Cho entitled "High-Speed Spiral-Scan Echo Planar NMR Imaging" in the *IEEE Trans. on Medical Imaging*, Vol. MI-5, March 1986. Here a constant frequency spiral is used to scan k space. This also deals with the same compromise in scan time between SNR and distortion. However, since the scan is circularly symmetric, the distortion or blur function is symmetric. Also, the scan of k space has a non-uniform linear velocity, being greatest at the higher spatial frequencies. This results in a loss of high frequency response.

A general approach to high speed magnetic resonance imaging appears in European patent application No. 80104808.3, filed 8/14/80, publication No. 0-024-640 entitled "Moving Gradient Zeugmatography" invented by Richard S. Likes. A number of methods are shown for scanning the spatial frequency domain following a single excitation for rapid data acquisition. These include Lissajou patterns and rosettes generated by sinusoids, a spiral with varying initial phase and concentric circles. These reasonably fill the spatial frequency domain. However, materials with relatively short $T_2$ relaxation times will produce distorted images, since only part of the spatial frequency domain will be scanned. If the scan is made short, to accommodate these materials, those with longer values of $T_2$ will therefore have reduced SNR because of the reduced integration times.

Another general approach to rapid imaging is described in a paper by A. Macovski entitled "Volumetric NMR Imaging with Time-Varying Gradients," in *Magnetic Resonance in Medicine*, Vol. 2 February 1985. Here systems are shown using sinusoidal and other gradient waveforms. Methods are shown for correcting the impulse response and applying time-varying gradients to spectroscopy.

BRIEF DESCRIPTION OF THE DRAWINGS

For a more complete disclosure of the invention, reference may be made to the following detailed description of several illustrative embodiments thereof which is given in conjunction with the accompanying drawings, of which:

FIG. 1 is a general Block diagram of a magnetic resonance imaging system;

FIG. 2 is a set of waveforms of an embodiment of the invention;

FIG. 3 is a spatial frequency diagram of the embodiment of FIG. 2;

FIG. 4 is a set of gradient waveforms of an alternate embodiment of the invention;

FIG. 5 is a spatial frequency diagram of the embodiment of FIG. 4;

FIG. 6 is the spatial frequency diagram of an embodiment utilizing half of the k space plane;

FIG. 7 is a set of waveforms corresponding to the embodiment of FIG. 6; and

FIG. 8 is the spatial frequency diagram of another embodiment of the invention.

DESCRIPTION OF THE PREFERRED EMBODIMENT

An understanding of the broad aspects of the invention may best be had by reference to FIG. 1 where the NMR parameters of object 10 are imaged. All of the standard coil structures are not shown, in the interest of clarity, since they are standard to all NMR imaging systems. $B_o$ is shown, by convention, in the z direction. This is the main field which is static, between 0.1 and 2.0 Tesla. The various gradient fields, $G_x$, $G_y$ and $G_z$, are of the order of 1.0 Gauss/cm and represent variations in x, y, and z of the z directed field. Coil 11 represents the ratio frequency excitation and reception. In some systems separate coils are used for excitation and reception, and in others, as shown in FIG. 1, the same coil is used. Switch 12 is used to switch between the two modes. It is first connected to position 13 where transmitter 15 generates an r.f. burst which is used to excite a region of interest, or the entire volume 10. Following the excitation burst is switched to position 14 to receive the resultant free induction decay signal or FID being emitted by the excited object 10. This signal is processed in processor 16 with the processed image displayed in display 17.

In existing commercial systems which utilize the 2DFT, a sequence of excitations are used each of which provides a line in the spatial frequency domain or k space. This array of lines is then transformed to form the desired image. These lines are produced by a static gradient in one of the gradient axes such as the $G_x$ axis. The $k_x$ value at any time is the integral of the gradient, thus forming a uniform scan in the x direction. The position of each line in the 2D array is determined by the area of a $G_y$ pulse prior to the readout interval. This determines the $k_y$ position of each line.

This approach, while providing high quality images, represents a long imaging time since each excitation interval is of the order of one second. Here we present an approach which collects the data very rapidly by scanning through either all or a major portion of k space following each excitation.

Other methods have been published for rapidly scanning k space. These have suffered, however, distortions due to the $T_2$ relaxation time. If a material in the image has a relatively short $T_2$ decay, its emitted signal will be present for only a portion of the k space scan, resulting in a poor impulse response and a distorted image. Systems which describe these rapid scans include the previously referenced papers by Mansfield, Cho, Likes and Macovski.

The Cho paper utilizes a spiral waveform starting from the origin and moving radially outward. This spiral, however, is of constant angular frequency, whereby the linear scan velocity decreases with increasing radius. Thus the scan spends less time at the higher spatial frequencies, attenuating their amplitude. This broadens the impulse response resulting in poorer resolution.

A preferable system is illustrated in FIG. 2. Here the waveforms have the general form $$G_x(t) = A \sin(B\sqrt{t}), \text{ and}$$

$$G_y(t) = A \cos(B\sqrt{t}).$$

This provides a constant velocity spiral representing a uniform distribution of near-circles. The radius increases with $\sqrt{t}$ and the angle varies as $\sqrt{t}$, resulting in substantially constant linear velocity.

FIG. 2 illustrates this rapid scan system used to produce a cross-sectional image in an x-y plane. Signal 13, the r.f. excitation signal, is burst 20, corresponding to the resonant frequency of the selected plane. The plane selection is accomplished in conventional fashion using gradient $G_z$. Waveform 21, occurring during burst 20 selects the desired section representing the z position which provides resonance. Waveform 22 provides uniform phase within the selected section. Following the excitation of the plane switch 12 is thrown to position 14 to receive the signals and the two previously described gradient waveforms are applied where $G_x(t)$ is waveform 23, $A \sin(B\sqrt{t})$ and $G_y(t)$ is waveform 24, $A \cos(B\sqrt{t})$.

Ignoring relaxation, the received signal 14 is given by $$v(t) = \int\int m(x,y) \exp[-i\gamma(x\int G_x(t)dt + y\int G_y(t)dt)]dxdy$$

where $\gamma$ is the gyromagnetic ratio. This expression represents a two-dimensional Fourier transform where the spatial frequency domain, or k space, is scanned. Here the instantaneous spatial frequencies $k_x(t)$ and $k_y(t)$ are given by $$k_x(t) = \frac{\gamma}{2\pi} \int G_x(t) dt, \quad k_y(t) = \frac{\gamma}{2\pi} \int G_y(t) dt.$$

Except for regions close to the origin, the radial component of the spatial frequency domain is given by $$\rho = \sqrt{k_x^2 + k_y^2} \approx \frac{\gamma A}{\pi B} \sqrt{t}$$

and the angle is given by $$\theta = \tan^{-1}\frac{k_y}{k_x} \approx B\sqrt{t}$$

This represents a constant velocity spiral which weights k space equally. It is illustrated by the solid line 27 in FIG. 3. Ignoring the dashed line, the scan of k space starts at the origin and produces the desired spiral. The constants A and B are adjusted to provide adequate sampling so that successive circles are close enough together to avoid aliasing, and that the entire space is scanned in the desired time.

One of the main problems encountered is that of the relaxation time $T_2$. As k space is scanned, the signal is decaying at the rate $e^{-t/T_2}$. Different materials in the sample being studied are decaying at different rates. Therefore, some materials, with long decay times, will experience all of k space, with a narrow impulse response, while other materials, with relatively short value of $T_2$, will experience primarily the low spatial frequencies, with a correspondingly broad impulse response.

One solution to this problem is a very rapid scan, with a relatively high value of B where all materials experience small decay. This, however, compromises the SNR of high $T_2$ materials which continue to emit signals for a long time. It also removes the $T_2$ sensitivity from the resultant images. The solution to this problem is a redundant scan of k space. Following the first scan, the path is reversed and repeated in the opposite direction. The entire forward scan and reversal can be repeated one or more times following each excitation with the resultant values added together. This both insures high SNR for high $T_2$ components and a resultant image whose intensity values vary with the $T_2$ time constant.

The k space reversal is achieved by reversing the polarity of both gradient waveforms and retracing the waveform. Thus we have, for two redundant scans, $$\begin{aligned} G(t) &= G(t) & 0 < t < T \\ &= -G(2T - t) & T < t < 2T \\ &= G(t - 2T) & 2T < t < 3T \\ &= -G(4T - t) & 3T < t < 4T \end{aligned}$$

where T is the time used to scan through k space.

FIG. 2 illustrates the reversal and retracing of the $G_x(t)$ and $G_y(t)$ waveforms with segments 25 and 26 respectively. These each continue until the entire reversed waveform is completed, returning the scan to the origin as indicated by the arrows on the solid line 27 in FIG. 3. The reconstruction of the image is accomplished using processor 16. A general approach to reconstruction is described in the previously referenced paper by A. Macovski "Volumetric NMR Imaging with Time-Varying Gradients" in *Magnetic Resonance in Medicine*, Vol. 2 February 1985. Here the received signal 14 is multiplied by the conjugate of the gradient modulation waveform as given by $$\hat{m}(x_0,y_0) = \int v(t)\exp[i2\pi(k_x(t)x_0 + k_y(t)y_0)]dt$$
$$= \int\int\int m(x,y)\exp[-i2\pi(k_x(t)(x - x_0) + k_y(t)(y - y_0))]dxdydt$$

where $\hat{m}(x_0, y_0)$ is the estimate of the magnetization at $x_0$, $y_0$ which is the convolution of $m(x,y)$ with the system impulse response. Thus, for each point in the reconstructed image $x_0$, $y_0$ we multiply by the appropriate function as shown, and integrate in processor 16. The processed magnetization $\hat{m}(x_0, y_0)$ is then displayed in 17.

A number of variations can be made on the redundant scan system. In the receive operation the various successive redundant scans can be weighed to improve the flatness of response. This, however, can adversely affect the SNR. Also, reversed scans can be made following subsequent excitations to provide flatter responses.

Using redundant scans at high resolution, with many loops in the spiral, the scanning speed, which is proportional to $\sqrt{G_x^2+G_y^2}$ increases, requiring more power from the gradient amplifiers. Also, the required sampling rate goes up, since k space has to be densely sampled in a short time. This requires more elaborate A to D converters and more buffer storage. Thus rapid, redundant, high resolution scans place a hardware burden on the system.

This burden can be reduced by interleaving as shown in FIG. 3. This also increases the SNR. A sequence of excitations are made, each followed by a scan of k space. This entire sequence can be a few seconds, well within a breath holding interval to avoid motion artifacts. If cardiac motions are involved, or blood with pulsatile behavior, the excitations can be gated to the EKG waveform. In any case, each of these sequences are varied in their initial timing so as to form an interleaved set in k space. FIG. 3 shows interleaved spiral scans made using successive excitations where the waveforms of FIG. 2 are repeated with a change in the initial phase of gradient waveforms $G_x$ and $G_y$. The initial slope $\alpha$ of the scan, or the slope at the origin, is given by $$\alpha = \tan^{-1}\frac{k_y}{k_x} = \tan^{-1}\frac{G_y}{G_x}.$$

The values of $\alpha$ can be symmetrically distributed to achieve an interleaved scan.

The reconstruction system previously described, multiplying by the conjugate of the integral of the gradient waveforms, can be computationally intensive. To minimize the computational burden we can make use of the 2DFFT which, for n pixels, requires approximately $n \log n$ operations rather than $n^2$, as well-known. The fast Fourier transform of FFT was first described in a paper by J. W. Cooley and J. W. Tukey in *Mathematical Computing*, vol. 19, April 1965, pp. 297-301. A good description is found in a paper by G. D. Bergland in *Spectrum*, vol. 6, July 1969, pp. 41-43. Here the 2D transform is sampled on a uniform cartesian grid as shown in the "square" spiral in FIG. 5. Curve 37 starts from the origin and, at constant velocity produces the square spiral shown. It is generated, as shown in FIG. 4, by a sequence of gradient pulses of increasing length 30-35 alternating between the $G_x$ and $G_y$ axes. The planar excitation waveforms preceding the gradients are identical to those of FIG. 2. Since $\sqrt{G_x^2+G_y^2}$ is a constant, the locus of k space is moving at constant velocity.

In all respects this scan can be treated identically to that of FIGS. 2 and 3. For reversed redundant scans to retrace k space the gradients are reversed after time T and the gradients are repeated in reverse order as shown with dashed waveforms 36. Also, interleaved scans can be generated as shown in dashed line 38, again produced by altering the initial phase of gradient waveforms. If initial pulses 30 and 33 are halved in width, and each subsequent pulse reduced in width by one time unit, a two to one interleaved scan will result. Greater interleaving is accomplished in the same manner.

In the processing operation, when the scans are completed we have a stored two-dimensional transform of the desired $\hat{m}(x_0, y_0)$. This is then reconstructed in processor 16 using a 2DFFT, with its associated high speed and low cost.

In any magnetic resonance imaging system, the signal amplitude, a reasonable time after excitation, is diminished in amplitude by inhomogeneity and chemical shift. The increasing phase shifts with time of different object points causes them to loose coherence. This dephasing can be corrected, as is well-known, using spin echoes produced by 180° excitations around the x or y axis, depending on the phase of the excitation. This causes the dephased spins to rephase or focus in a time equal to the time taken to dephase. These spin echoes can be applied to the systems of FIGS. 1-5 to prevent loss of coherence and allow data collection during the entire relaxation time interval.

One approach to the use of spin echoes is shown in FIGS. 6-7. Here they are used to generate a square spiral in the upper half of k space. Again the system is excited by burst 50 from transmitter 15 via switch terminal 13. Slice select gradient $G_z$ is not shown. If slice selection is desired, waveforms 21 and 22 of FIG. 2 can be used. The excitation is followed by a sequence of gradient pulses, 55, 53, and 56, which move the k space locus 40 up, right and down from the origin to position 41. At this time 180° burst 51 causes the k space locus to move to its conjugate position 45. This is followed by gradient pulses 57, 54 and 58 which again cause the up, right, and down scans from point 45 to point 42. This is followed by 180° burst 52 which moves the locus from 42 to 46. The sequence is repeated again, starting with gradient pulse 59 to move from 46 to 43. Each successive sequence adds one unit of width to the up and down gradient pulses of $G_y$ and two units of width to the "right" gradient pulses of $G_x$. We continue with a 180° burst, not shown, moving the locus from 43 to 47, around to 44, and another 180° burst from 44 to 48. In this manner an entire half plane is generated.

This same sequence can be repeated, with the $G_y$ gradients all reversed, to provide the other half of k space to provide the 2DFT of the entire image. This is then subjected to a 2DFFT, in processor 16, to display the image in display 17. This use of 180° bursts can also be used with the circular spiral of FIGS. 2 and 3. Following each complete cycle of $G_y$ such as from peak to peak in waveform 24, we use a 180° burst to traverse the $k_x$ axis. This is followed by a half positive cycle of wavefrom 23. The negative half cycles of waveform 23 are not used. Thus we have a sequence of complete cycles of $G_y$, 180° burst and half cycle of $G_x$, where the frequency decreases as shown in FIG. 2.

Under certain conditions the half plane of k space shown in FIG. 6 is sufficient to reconstruct the image. This would be desirable since it would cut the scan time in half. If the desired image m(x,y) is real valued, then its Fourier transform is Hermitian, meaning the real part is even and the imaginary part odd. Therefore, for each $M(k_x, k_y)$ in the positive half, we can assign $M(-k_x, -k_y)=M^*(k_x, k_y)$ in negative half, where * indicates complex conjugate. Many magnetic resonance systems, however, exhibit phase shifts due to inhomogeneity, chemical shift, eddy currents, etc. These cause the transform to be non-Hermitian. Thus errors will occur when the negative half plane of k space is estimated. These errors can be reduced if, for example, the phases are modified, through subtracting a constant phase, to force the origin to have zero phase shift.

FIG. 8 illustrates an alternative k space scan which minimizes the effect of phase shifts. Here the low frequency region has a complete scan, with the higher frequency regions limited to the upper half plane. The complete low frequency region can be produced as in FIG. 5, without 180° excitations, or, as in FIGS. 6-7, with 180° excitations with the negative half done separately. The higher frequency regions are produced as in FIGS. 6-7 with 180° excitations occurring at 66, 67, 68 and 69 translating the locus to 70, 71, 72 and 73 respectively. In general, images are more sensitive to lower frequency phase errors than high frequency phase errors. Where the entire k space is present we reconstruct $m(x,y)e^{i\theta(x,y)}$ where $\theta(x,y)$ are the phase shift errors. By simply taking the magnitude we achieve an undistorted $|m(x,y)|$, as is done in present day systems. Using the system of FIG. 8 we can first reconstruct the low frequency region by an inverse transform followed by a magnitude operation to create $|m_1(x,y)|$ where $m_1$ represents the lower frequency region of m. The remainder of the spectrum is reconstructed using the Hermitian approximation to estimate the missing half of k space. These are then combined to produce an acceptable image, since errors in the higher frequency regions are more tolerable.

An alternate approach, again using the data acquisition approach of FIG. 8, makes use of the assumption that cos $\theta(x,y)$ and sin $\theta(x,y)$ are "slow-varying" functions, representing low-frequency spectrum. Therefore the Fourier transform of $e^{i\theta(x,y)}$ is $L(k_x, k_y)$, a spectrum which is comparable in size or smaller than the symmetrical low-frequency region in FIG. 8. Under that assumption, the inverse transform of the symmetric region is $m_1(x,y)e^{i\theta(x,y)}$. Dividing this by $|m_1(x,y)|$ we get $e^{i\theta(x,y)}$ and then, by tranforming, we obtain $L(k_x, k_y)$. Having derived $\theta(x,y)$ and $L(k_x, k_y)$ we can correct the remainder of $M(k_x, k_y)$, making it Hermitian.

The acquired data is $M(k_x, k_y)$, * $L(k_x, k_y)$, the transform of $m(x,y)e^{i\theta(x,y)}$. We can deconvolve M * L by convolving it with the transform of $e^{-i\theta(x,y)}$ which is L, with the odd portion reversed in polarity. Once we have the $M(k_x, k_y)$ values, we can use the Hermitian properties to reconstruct the negative half where $M(-k_x, -k_y)=M^*(k_x, k_y)$.

Another approach to partial scans of k space, using the same theme, involves combining interleaved scans. In a first scan, we can produce the upper half of k space, as in FIG. 6. We then, in the next excitation, follow with an interleaved scan as in the system of FIG. 5, except that we only produce the bottom half of k space, as represented by the dashed lines below the $k_x$ axis. We thus interleave the $|k_x|$ and $|k_y|$ values in different halves of k space. We then estimate all of k space using interpolation schemes. Each point in k space can be averaged with its neighbors, which are obtained by Hermitian reflection from the opposite half of k space.

The systems of FIGS. 3 and 5 are examples of general systems of spiral-type scans containing successive loops of increasing distance from the origin. For example, hexagon or octagon patterns can be generated by modifying the gradient waveforms. For any of the spiral-type scans we can emply the reversed direction retrace of the locus so as to minimize distortion due to $T_2$ relaxation and provide an image which is $T_2$ sensitive. Also, we can employ the interleaved scans on successive scans to minimize the gradient power and sampling requirements, as illustrated in FIGS. 3 and 5. In addition, with any of the spiral-type scans, we can use 180° inversions as in FIG. 6, and also employ scans of part of k space, as in FIGS. 6 and 8.

The various fast scan embodiments described thusfar will provide cross-sectional or projection images of the magnetic resonance activity in the excited region. However, in some cases it is desired to provide a projection image of blood vessels only, creating an acquisition. Systems of this type have been described in a paper by A. Macovski in the *IEEE Transactions on Medical Imaging*, vol. MI-1, pp. 42-48 (1982). The fast scans would enable vessel images to be obtained rapidly without any concern about cardiac or respiratory motion. If the multiple scan interleaved embodiments are used, each excitation can be timed to the EKG signal to avoid errors due to cardiac motion. In general, projection imaging, using non-selective excitation, is used for angiography. Thus the excitation of FIG. 2 would be non-selective, without gradient $G_2$. A number of approaches described in the previously referenced paper can be used to cancel static tissue and image solely moving material. The excitation can be a "cancelling" excitation, of the type which returns static material to equilibrium and excites only moving material. Alternatively temporal subtraction can be used where data is acquired at two different portions of the heart cycle, corresponding to different velocities of blood, and subtracted.

What is claimed:

1. In a method for providing a magnetic resonance image of a region in a volume in the presence of a constant magnetic field the steps of;

exciting the region with a radio frequency burst;

applying magnetic gradient waveforms to two orthogonal axes normal to the constant magnetic field where the magnitudes of the two gradients are substantially constant and the integral of the gradient waveforms, representing the spatial frequencies of the image, form an array of loops of increasing distance from the origin;

applying magnetic gradient waveforms which cause the integral of the gradient waveforms to return to the origin along substantially the same array of loops;

receiving magnetic resonant signals while the gradient waveforms are applied; and processing the magnetic resonant signals to produce an image of the region.

2. The method as described in claim 1 including repeating the steps of applying magnetio gradient waveforms so as to provide additional retracing of the same path through spatial frequency space.

3. The method as described in claim 1 where the steps of applying gradient waveforms use waveforms where the radial component and the angular component of the spatial frequencies vary substantially as the square root of time whereby a spiral locus is produced in spatial frequency space.

4. The method as described in claim 1 where the steps of applying gradient waveforms use a sequence of constant amplitude square waveforms to the two orthogonal axes where one gradient is on when the other is off and the waveforms are increasing in duration time whereby a "square" spiral is produced in spatial frequency space.

5. The method of described in claim 1 wherein the excitation step includes the step of applying a gradient signal to said volume and exciting a plane in the volume normal to said gradient signal whereby the image produced is a cross-sectional image of the excited plane.

6. The method of described in claim 1 wherein the excitation step includes the step of exciting the entire volume of interest in the absence of a gradient signal whereby the image produced is a projection image of the excited volume.

7. In a method for providing a magnetic resonance image of a region in a volume in the presence of a constant magnetic field the steps of;
 exciting the region with a radio frequency burst;
 applying magnetic gradient waveforms to two orthogonal axes normal to the constant magnetic field where the integral of the gradient waveforms, representing the spatial frequencies of the image, form an array of loops of increasing distance from the origin;
 exciting the region with an inverting excitation during the course of the magnetic gradient waveforms;
 receiving magnetic resonant signals while the magnetic gradient waveforms are applied; and
 processing the magnetic resonant signals to produce an image of the region.

8. In a method for providing a magnetic resonance image of a region in a volume in the presence of a constant magnetic field the steps of;
 exciting the region with a radio frequency burst;
 applying magnetic gradient waveforms to two orthogonal axes normal to the constant magnetic field where the integral of the gradient waveforms, representing the spatial frequencies of the image, form an array of loops of increasing distance from the origin which are confined to a half-plane of the spatial frequency spectrum;
 receiving magnetic resonant signals while the gradient waveforms are applied; and
 processing the magnetic resonant signals to produce an image of the region.

9. The method as described in claim 8 where the step of applying magnetic gradients whose integrals are confined to a half plane of the spatial frequency spectrum includes the step of applying inverting excitations to traverse the line separating the half planes of the spatial frequency spectrum.

10. The method as described in claim 8 including the step of applying gradients whose integrals traverse the unused half of the spatial frequency spectrum solely in the low frequency region of the spectrum and where the processing step includes the step of using the low frequency spectrum to correct the phase errors of the entire spectrum.

11. In a method for providing a magnetic resonance image of a region of body in the presence of a constant magnetic field the steps of;
 exciting the region with a sequence of radio frequency bursts;
 applying magnetic gradient waveforms to two orthogonal axes normal to the constant magnetic field following each burst where the magnitude of the two gradients is substantially constant and where the integral of the gradient waveforms, representing the spatial frequencies of the image, form an array of loops of increasing distance from the origin and the locus of the integral of the gradient waveforms is different following each burst whereby the spatial frequency spectrum is filled;
 receiving magnetic resonant signals while the gradient waveforms are applied; and
 processing the magnetic resonant signals to produce an image of the region.

12. The method as described in claim 11 where the step of applying magnetic gradients following each burst includes the step of interleaving the loci of the integrals of the gradient waveforms.

13. The method as described in claim 11 where the step of exciting the region includes the step of timing the excitation with the cardiac rate of the patient being studied.

14. In a method for providing a magnetic-resonance image of a region in a volume in the presence of a constant magnetic field the steps of;
 exciting the region with a radio frequency burst;
 applying magnetic gradient waveforms to two orthogonal axes normal to the constant magnetic field where the magnitude of the two gradients is substantially constant and where the integral of the gradient waveforms, representing the spatial frequencies of the image, form an array of loops of increasing distance from the origin where a set of equally spaced time samples of magnetic resonance signals are positioned on a rectangular grid in the spatial frequency domain;
 receiving magnetic resonant signals while the gradient waveforms are applied;
 sampling the received signals; and
 processing the received signals using a two-dimensional fast Fourier transform to produce an image of the region.

15. The method as described in claim 14 where the step of applying gradient signals includes the step of applying a sequence of rectangular pulses alternating between the two orthogonal axes with increasing duration to provide a gradient integral whose locus is a sequence of rectangular loops.

16. Apparatus for providing a magnetic resonance image of a region in a volume comprising:
 means for applying a constant magnetic field through the region,
 means for exciting the region with a radio frequency burst;
 means for applying magnetic gradient waveforms to two orthogonal axes normal to the constant magnetic field where the magnitude of the two gradients is substantially constant and where the integral of the gradient waveforms, representing the spatial frequencies of the image, form an array of loops of increasing distance from the origin;
 means for applying magnetic gradient waveforms which cause the integral of the gradient waveforms to return to the origin along substantially the same array of loops;

means for receiving magnetic resonant signals for an excited phone while the gradient waveforms are applied; and means for processing the magnetic resonant signals to produce an image of the region.

17. Apparatus as described in claim 16 where the means for applying gradient waveforms includes means for applying waveforms where the radial spatial frequency component and the angular spatial frequency component vary substantially as the square root of time whereby a spiral locus is produced in spatial frequency space.

18. Apparatus as described in claim 16 where the means for applying gradient waveforms includes means for applying a sequence of constant amplitude square waveforms to the two orthogonal gradient axes where one gradient is on while the other is off and the waveforms are increasing in duration whereby a "square" spiral is produced in spatial frequency space.

19. Apparatus as described in claim 16 wherein said means for exciting the region includes means for applying a gradient signal normal to the excited plane and where the excited region is the entire volume of interest whereby a projection image of the excited volume is produced.

20. Apparatus as described in claim 16 wherein said means for exciting the region excites the region in the absence of a gradient signal and where the excited region is the entire volume of interest whereby a projection image of the excited volume is produced.

21. Apparatus as described in claim 16 including means for providing a sequence of radio frequency excitations and where the initial timing of the gradient waveforms is adjusted such that successive scans of the spatial frequency spectrum are interleaved.

22. Apparatus for providing a magnetic resonance image of a region in a volume comprising:

means for applying a constant magnetic field through the region, means for exciting the region with a radio frequency burst;

means for applying a sequence of constant amplitude square magnetic waveforms to two orthogonal axes normal to the constant magnetic field where one gradient is on while the other is off and each waveform is increasing in duration and reversing in polarity whereby a "square" spiral is produced in spatial frequency space.

23. Apparatus for providing a magnetic resonance image of a region in a volume comprising:

means for applying a constant magnetic field through the region, means for exciting the region with a radio frequency burst;

means for applying magnetic gradient waveforms to two orthogonal axes normal to the constant magnetic field where the integral of the gradient waveforms, representing the spatial frequencies of the image, form an array of half loops of increasing distance from the origin in a half plane of the spatial frequency spectrum;

means for receiving magnetic resonant signals while the gradient waveforms are applied; and means for processing the magnetic resonant signals to produce an image of the region.

24. Apparatus as described in claim 23 where the means for applying magnetic gradient waveforms also produce a complete two-sided spectrum in the low frequency portion of the spectrum.

25. Apparatus as described in claim 23 including means for applying inverting radio frequency excitations when the integral of the gradient waveforms corresponds to the edge of the half plane of the spatial frequency spectrum enabling the locus of a scan of the spatial frequency spectrum to move to its conjugate position.

* * * * *